United States Patent [19]

Ellwanger

[11] Patent Number: 4,946,803
[45] Date of Patent: Aug. 7, 1990

[54] METHOD FOR MANUFACTURING A SCHOTTKY-TYPE RECTIFIER HAVING CONTROLLABLE BARRIER HEIGHT

[75] Inventor: Russell C. Ellwanger, Orem, Utah

[73] Assignee: North American Philips Corp., Signetics Division, Sunnyvale, Calif.

[21] Appl. No.: 282,232

[22] Filed: Dec. 8, 1988

Related U.S. Application Data

[62] Division of Ser. No. 447,745, Dec. 8, 1982, Pat. No. 4,816,879.

[51] Int. Cl.$^5$ ............ H01L 21/00; H01L 21/02; H01L 21/283; H01L 21/285
[52] U.S. Cl. ............ 437/175; 437/176; 437/177; 437/178; 437/179; 357/15; 357/67; 357/71; 148/DIG. 139; 148/DIG. 140
[58] Field of Search ............ 437/175, 176, 177, 178, 437/179, 200, 201; 148/DIG. 139, DIG. 140, DIG. 147; 156/657; 357/15; 204/192.15, 192.25

[56] References Cited

U.S. PATENT DOCUMENTS

| | | | |
|---|---|---|---|
| 3,855,612 | 12/1974 | Rosvold | 357/15 |
| 3,938,243 | 2/1976 | Rosvold | 148/DIG. 139 |
| 3,964,084 | 6/1976 | Andrews, Jr. et al. | 357/89 |
| 4,201,999 | 5/1980 | Howard et al. | 357/15 |
| 4,816,879 | 3/1989 | Ellwanger | 357/67 |

OTHER PUBLICATIONS van Gurp, G., Aluminum–Silicide Reactions II. Schottky-Barrier Height, J. Appl. Phys. 50(11), Nov. 1979, pp. 6923–6926.

Stolt, L., Variation of PtSi–nSi Barrier Height with Fabrication Parameters, and Characterization of the Electrical Behavior of the Junction, Physica Scripta, vol. 18, 1978 (Dec.), pp. 410–412.

*Primary Examiner*—Brian E. Hearn
*Assistant Examiner*—B. Everhart
*Attorney, Agent, or Firm*—T. Briody; A. Tamoshunas; R. Meetin

[57] ABSTRACT

A Schottky-type diode is fabricated by a process that enables the diode's conductor-to-semiconductor barrier height $\phi_B$ to be controlled by adjusting the thickness of a metal silicide layer (22) which forms a rectifying junction (20) with an N-type semiconductor (24). In fabricating one version of the diode, a metallic layer (70) consisting of two or more metals such as platinum and nickel is deposited on an N-type silicon semiconductor (68) and heated to create a metal silicide layer (72) consisting of a lower layer (62) and an upper layer (74) of different average composition. A portion of the upper layer is then removed, allowing $\phi_B$ to be adjusted suitably.

4 Claims, 3 Drawing Sheets

METHOD FOR MANUFACTURING A SCHOTTKY-TYPE RECTIFIER HAVING CONTROLLABLE BARRIER HEIGHT

CROSS REFERENCE TO RELATED APPLICATION

This is a division of U.S. Pat. application Ser. No. 447,745, filed Dec. 8, 1982, now U.S. Pat. No. 4,816,879. This also contains material of a similar nature to that in U.S. Pat. application Ser. No. 447,738, filed Dec. 8, 1982, now abandoned.

FIELD OF USE

This invention relates generally to Schottky-type rectifying elements suitable for integrated circuits and more particularly to such rectifiers that use metal silicides in their construction. This invention also relates to methods for rectifier manufacturing.

BACKGROUND ART

The junction between a metal and an N-type semiconductor may be either rectifying or ohmic—i.e., non-rectifying—depending on the characteristics of the materials in the metal-semiconductor system. As pointed out by R. Muller et al in *Device Electronics for Integrated Circuits* (John Wiley and Sons: New York), 1977, the work function distinguishes a rectifying junction from an ohmic junction. The work function is a measure of the average energy needed to raise an electron from the Fermi energy level to an energy level at which the electron is just free of the influence of the system. If the work function of the metal is greater than that of the semiconductor when the materials are not interacting, a rectifying junction is formed when they interact.

For the rectifying junction, a charge depletion region consisting of bound positive charges exists on the semiconductor side of the interface. In an idealized system, the electrons associated with the bound positive charges are situated in the metal right next to the interface—i.e., no more than several monolayers into the metal. This sets up an induced electric field directed across the depletion region toward the interface where the field essentially ends. As a result, a built-in voltage $\phi_I$ whose magnitude depends on the N-type dopant concentration in the semiconductor exists across the depletion region. The built-in voltage represents an energy barrier $q\phi_I$ that electrons in the semiconductor conduction band must overcome to cross the interface and enter the metal. q is the electronic charge. This energy barrier can be reduced by applying an external voltage that is positive with respect to the semiconductor. As the applied voltage is increased, a point is eventually reached at which electrons flow freely from the semiconductor to the metal. $\phi_I$ is thus indicative of the conductive forward voltage drop $\phi_{SH}$ across the rectifying junction. However, $\phi_I$ is often difficult to measure directly.

A parameter more readily ascertainable from the current/voltage characteristics of the system is the Schottky barrier height, represented as $\phi_B$ in electrostatic potential units or as $q\phi_B$ in energy units, that electrons in the metal at the Fermi level must overcome to cross the interface and enter the semiconductor. Because $\phi_B$ is greater than $\phi_I$ and is not affected to any significant degree by the applied voltage in the idealized system, very few electrons in the metal can enter the semiconductor. $\phi_B$ is also linearly related to $\phi_I$ and therefore provides a direct measure of $\phi_{SH}$.

Numerous types of metal-semiconductor rectifying elements, generally referred to as Schottky diodes, have been considered. The oldest Schottky diodes utilize aluminum as the metal and doped silicon as the N-type semiconductor. These basic Al-Si diodes are manufactured relatively easily. However, they degrade relatively fast as the aluminum intermixes with the silicon.

In view of this problem, other materials have been sandwiched between the aluminum and silicon in more recent Schottky diodes. In one of the principal arrangements, a diode is formed on a semiconductor body which has an appropriately doped N-type semiconductive region. A layer of a metal silicide adjoins the N-type region to define a rectifying junction at the interface between the N-type region and the silicide layer. The junction is still referred to as a metal-semiconductor or Schottky junction since metal silicides have been conventionally thought to be metallic in nature. The silicide is typically platinum silicide whose $q\phi_B$ with N-type silicon is 0.79–0.83 electron volt (eV) depending on the dopant concentration. As, for example, described by W. Rosvold in U.S. Pat. No. 3,855,612, nickel is often included with platinum in the silicide layer. The nickel reduces the junction $q\phi_B$ since the nickel $q\phi_B$ is about 0.63–0.67 eV with N-type silicon.

The thickness of the silicide layer is typically on the order of 1,000 angstroms and is normally no less than about 500 angstroms. This thickness is employed because of the conventional belief that this much silicide is needed to make the silicide layer stable and to avoid continuity defects such as pinholes in it.

A conductive non-silicide layer typically consisting of a barrier metal such as tungsten or titanium-tungsten ohmically adjoins the silicide layer across from the rectifying junction. The barrier metal substantially prevents the materials on either side of it from diffusing through it to the other side. Also, the barrier metal does not diffuse into the silicide. Finally, an aluminum layer normally overlies the barrier metal.

In one method for manufacturing a rectifying element of the above type, a metallic layer composed of at least two selected metals such as platinum and nickel is deposited on an exposed surface of an N-type silicon semiconductive region in a semiconductor body. The resultant structure is heated to a suitable temperature to cause the metal to react with adjacent silicon and form the metal silicide layer. Any deposited metal that has not reacted to form silicide is suitably removed. The non-silicide layer is then formed after which the aluminum layer is created.

While known Pt-based silicide Schottky diodes perform well without significant junction degradation, they are relatively expensive because of the high cost of platinum. In a Schottky diode whose silicide layer is constituted with two or more metals, controlling the ratio of these metals to one another in the deposition target employed in forming the metallic layer later converted to silicide is also difficult. It is desirable to have a less expensive silicide Schottky-type diode whose $\phi_B$ can be varied so as to appropriately tailor $\phi_{SH}$ more simply than in the prior art.

DISCLOSURE OF THE INVENTION

In accordance with the invention, a conductor-semiconductor rectifying element suitable for an integrated circuit has a conductive forward voltage drop that is controllably varied by appropriately adjusting the thickness of a metal silicide layer that forms a rectifying junction at an interface between the silicide layer and an N-type semiconductive region of a semiconductor body. A conductive non-silicide layer ohmically adjoins the silicide layer across from the rectifying junction. The silicide layer is sufficiently thin that the actual conductor-to-semiconductor barrier height $\phi_B$ at the junction does not substantially equal the intrinsic conductor-to-semiconductor barrier height $\phi_{BO}$ at an interface between material which is the same as the N-type region along the junction and material which is the same as the silicide layer along the junction and has the same average composition as the silicide layer. The intrinsic barrier height $\phi_{BO}$ is the barrier height that would exist if the silicide layer were effectively of infinite thickness.

More particularly, the absolute value of $(\phi_{BO}-\phi_B)/(\phi_{BO}-\phi_{BN})$ is at least 15% and preferably at least 25%. $\phi_{BN}$ is the conductor-to-semiconductor barrier height at an interface between material which is the same as the N-type region along the junction and material which is the same as the non-silicide layer.

The invention is based on the discovery that a silicide constituted with a metal such as platinum and/or nickel appears capable of sustaining a small electric field in somewhat the manner that an electric field exists across a conventional semiconductor PN junction. By making the silicide layer thin enough, a self-induced electric field originating in the charge depletion region of the N-type region penetrates through the silicide layer and into the non-silicide layer. Because of this field penetration into the non-silicide layer, the work function of the silicide layer "mixes" with the work function of the non-silicide layer. As a result, $\phi_B$ differs from $\phi_{BO}$ which is the barrier height for prior art Schottky diodes.

Typically, fabrication of the present rectifier only involves depositing less metal for the silicide layer than in the prior art. Consequently, $\phi_B$ can be readily adjusted here without going through difficult-to-control deposition target composition changes used to vary the forward voltage drop in some previous Schottky diodes.

For one embodiment of the invention in which the silicide layer comprises PtSi, its thickness is in the range of 15–250 angstroms. Optimally, the PtSi is 60–80 angstroms thick, while the non-silicide layer consists of tungsten or titanium-tungsten as a barrier metal. In this case, work-function mixing makes $q\phi_B$ about 0.74 eV which is about 0.07 eV less than $q\phi_{BO}$ of the comparable prior art Schottky diodes which utilize 500 angstroms or more of PtSi. The 0.74-eV $q\phi_B$ is quite adequate for many semiconductor applications and is achieved with a small fraction of the platinum employed in comparable prior art PtSi Schottky diodes.

In an important variation where two or more selected metals are used in the silicide layer, it is the remainder of an original metal silicide layer of greater thickness. Because of this difference, $\phi_{BO}$ is taken with respect to material which has the same average composition as the original silicide layer since its average composition generally differs from that of the (remaining) silicide layer. This occurs because the silicide layer consists of two or more generally distinct layers. One of these adjoins the N-type region, while another overlies the first and has a different average composition.

In fabricating a diode according to this variation, a metallic layer composed of the selected metals is deposited on an exposed surface of an N-type silicon semiconductive region in a semiconductor body. The resultant structure is heated to a suitable temperature to form the original silicide by reaction of the metallic layer with silicon along the surface. The metals and dopant concentration of the N-type region are so selected that the interface between the silicide layer and the remainder of the N-type region is a rectifying junction. Next, a non-insubstantial portion of the thickness of the original silicide layer is removed across from the junction so as to establish the desired $\phi_B$. Subsequently, a non-silicide layer normally consisting of a barrier metal is formed on the (remaining) silicide layer. A layer of a suitable conductor such as aluminum can then be deposited on the non-silicide layer.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

Figure 1:
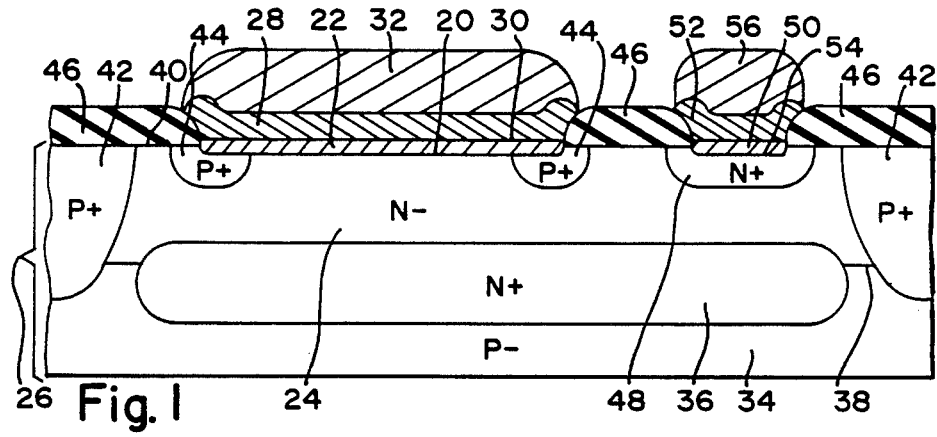
FIG. 1 is a cross-sectional side view of a semiconductor structure containing a Schottky-type rectifier according to the invention.

Referring to the drawings, FIG. 1 illustrates a side view of a semiconductor structure containing a Schottky-type rectifier whose actual conductor-to-semiconductor barrier height $\phi_B$ at its rectifying junction 20 is readily controllable. Junction 20 is located at the interface between a metal silicide layer 22 and an N− semiconductive region 24 in a monocrystalline silicon semiconductor body 26 of an integrated circuit.

The thickness t of silicide layer 22 is at least 15 angstroms. To avoid pinholes and other such continuity defects in layer 22, t is preferably at least 50 angstroms. Layer 22 consists of silicon chemically combined with a metal such as platinum or nickel or with two or more such metals. In a preferred embodiment, layer 22 is PtSi for which thickness t is no more than 250 angstroms and is desirably no more than 100 angstroms. t is optimally 60–80 angstroms in this embodiment.

N− region 24 has a substantially uniform net N-type dopant concentration of no more than about $2 \times 10^{17}$ atoms/cm$^3$ (corresponding to a resistivity of 0.05 ohm-cm). This assures that junction 20 is indeed rectifying (rather than ohmic). The optimum net N-type dopant concentration in N− region 24 is about $9.8 \times 10^{15}$ atoms/cm$^3$ (corresponding to a resistivity of about 0.3 ohm-cm).

An electrically conductive non-silicide layer 28 consisting of a metal such as tungsten or titanium-tungsten which acts substantially as a diffusion barrier to silicon and aluminum at 520° C. or less ohmically adjoins silicide layer 22 along an interface 30. Optimally, layer 28 consists of about 1,000 angstroms of Ti-W alloyed in the proportions of 85% tungsten to 15% titanium. The Schottky barrier height $q\phi_{BN}$ at an interface between Ti-W in the foregoing proportions and N-type monocrystalline silicon at the optimum dopant concentration above is about 0.65 eV.

In the optimal embodiment described above for which the thickness t of the PtSi in layer 22 is 60–80 angstroms, it is so thin that the forward voltage drop $\phi_{SH}$ across junction 20 is about 350 mV at a junction current I of 10 μa and a diode temperature T of about 25° C. $\phi_B$ is calculated as a function of $\phi_{SH}$ from the relationship $$I = R^* A T^2 e^{-q\phi_B/kT} (e^{q\phi_{SH}/nkT} - 1)$$

In this relationship, R* is Richardson's constant, k is Boltzmann's constant, and n is the ideality factor. A is the interfacial area of junction 20. In the present case, A is about $4.6 \times 10^{-6}$ cm$^2$, and n is about 1.04. Accordingly, $q\phi_B$ is about 0.74 eV. Furthermore, $q\phi_B$ can be reduced to about 0.72 eV by decreasing t to 50 angstroms or raised to about 0.76 eV by increasing t to 100 angstroms.

For purposes of comparison, the intrinsic Schottky barrier height $\phi_{BO}$ means the conductor-to-semiconductor barrier height for a reference diode whose rectifying junction is at the interface of an N-type region and a reference silicide layer of effectively infinite thickness—i.e., on the order of 1,000 angstroms. This N-type region is defined as being compositionally the same as N− region 24 along junction 22. Similarly, the reference silicide layer is defined as being composed of the same material as that of silicide layer 22 along junction 20. The reference silicide layer is also defined as having the same average composition as layer 22. The reference diode is thus basically the comparable prior art silicide Schottky diode.

If the reference diode is the same as the optimal diode described above except for the difference in PtSi thickness, $q\phi_{BO}$ is about 0.81 eV. This contrasts sharply with the actual 0.74-eV value for $q\phi_B$. The comparison parameter $|(\phi_{BO}-\phi_B)/(\phi_{BO}-\phi_{BN})|$, which is a measure of the difference between the present rectifier and the reference diode, is then 44%.

Returning to FIG. 1, a layer 32 of a material suitable for electrically interconnecting non-silicide layer 28 with other elements of the integrated circuit lies on the top of layer 28. Layer 32 is preferably a highly conductive metal, optimally aluminum with about 1% copper having a thickness of 1.1 microns. Alternatively, layer 32 could consist of doped polycrystalline silicon or doped amorphous silicon.

In body 26, a P− substrate region 34 underlies N− region 24. A highly doped N+ buried region 36 lies along the interface 38 between regions 24 and 34. Buried region 36 extends about 6 microns below interface 38 and slightly above it as well. N− region 24, which extends about 3.7 microns upward from interface 38 to the upper surface 40 of body 26, is basically an active semiconductor region laterally isolated from other such semiconductor regions by a deep annular highly doped P+ region 42 laterally surrounding N− region 24 and extending downward about 5,000 angstroms below interface 38. A shallow annular highly doped P+ region 44 underlies the portion of layer 22 outside the lateral boundary of junction 20 and extends laterally outward beyond the side edge of layer 22. P+ layer 44, which extends downward about 1.2 microns below surface 40, is a guard ring for reducing leakage currents. A patterned electrically insulating layer 46 of silicon dioxide whose thickness is 3,500–4,000 angstroms overlies isolation region 42, parts of N− region 24, and the part of guard ring 44 extending laterally outward beyond the side edge of layer 22.

In addition, FIG. 1 illustrates an ohmic electrical contact to N− region 24. This contact consists of a highly doped N+ region 48, a metal silicide layer 50, and an electrically conductive non-silicide layer 52. N+ region 48 extends downward from surface 40 about 1.2 microns into body 26. Silicide layer 50 downwardly adjoins N+ region 48 at a junction 54. Non-silicide layer 52 ohmically adjoins silicide layer 50 at its upper surface. Also shown is an electrically conductive layer 56 lying on the top of non-silicide layer 52. Layers 50, 52, and 56 preferably consist of the same respective materials and have the same respective thicknesses as layers 22, 28, and 32. The net N-type dopant concentration in N+ region 48 along interface 54 is about $5 \times 10^{21}$ atom/cm$^3$ (corresponding to a sheet resistance of about 10 ohms/square). As a result, interface 54 is an ohmic junction. During operation, electrons travel from the contact through N− region 24 to buried region 36 and then along it to a location below silicide layer 22 where they pass back through region 24 and across junction 20.

In fabricating the structure of FIG. 1, the starting material is a boron-doped P− monocrystalline silicon semiconductor substrate having a resistivity of 7–21 ohm-cm. Arsenic is selectively diffused into the top surface of the substrate at the general location for N+ region 36. After exposing surface 38, an arsenic-doped N− epitaxial layer having a resistivity of about 0.3 ohm-cm is grown on the top of the substrate. During this and subsequent processing steps, the arsenic suitably redistributes to form buried N+ region 36 at a sheet resistance of 10–12 ohms/square.

A layer of silicon dioxide is thermally grown along the top of the structure. After opening a suitable window through this oxide layer, boron is diffused in through this window to form isolation region 42 at a sheet resistance of about 5 ohms/square. A layer of silicon dioxide is thermally grown to close this window. After opening another suitable window through the resulting oxide layer, boron is again diffused to form guard ring 44 at a sheet resistance of about 200 ohms/square. The steps of oxide growth, new window opening, and diffusion are then repeated with phosphorus to form N+ region 48. Another layer of silicon dioxide is thermally grown to close the window for N+ region 48. Layer 46 is the resultant oxide layer.

Windows are now opened through oxide layer 46 at the sites for the diode and the contact. The structure is suitably cleaned, after which an in situ sputter etch is performed with argon ions to remove any silicon dioxide in the diode and contact windows.

A layer of platinum having a thickness of about 35 angstroms is deposited according to conventional sputtering techniques on the top surface of the structure including the surface of the silicon exposed through the windows in oxide layer 46. The structure is then sintered for 20 minutes at 450° C. in an environment of dry nitrogen with 1% hydrogen to cause the platinum to react with silicon along the exposed surfaces at both windows so as to form layers 22 and 50 of PtSi. In this reaction, each unit of Si thickness reacts with about one unit of Pt thickness to form about two units of PtSi thickness. Any platinum that has not reacted to form PtSi is then removed by etching with hot aqua regia. A 1,000-angstrom layer of Ti-W at the above proportions is deposited according to conventional sputtering techniques on the top of the structure and suitably etched with hydrogen peroxide to define layers 28 and 52. In a similar manner, a layer of aluminum with about 1% copper is deposited on the top of the resultant structure and suitably patterned by etching with sulfuric/phosphoric acid to create layers 32 and 56. The structure is then finished in a conventional manner.

As described above, $\phi_B$ at junction 20 differs from $\phi_{BO}$ by a non-insubstantial amount. This difference is believed to arise because the self-induced electric field directed across the depletion region in N− region 24 toward junction 20 penetrates through the entire thickness t of silicide layer 22 and into non-silicide layer 28. The self-induced field terminates next to interface 30—i.e., no more than several monolayers into layer 28. The further field penetration through silicide layer 22 is thought to occur because the silicide in layer 22 is partially semiconductive in nature.

Figure 2A:
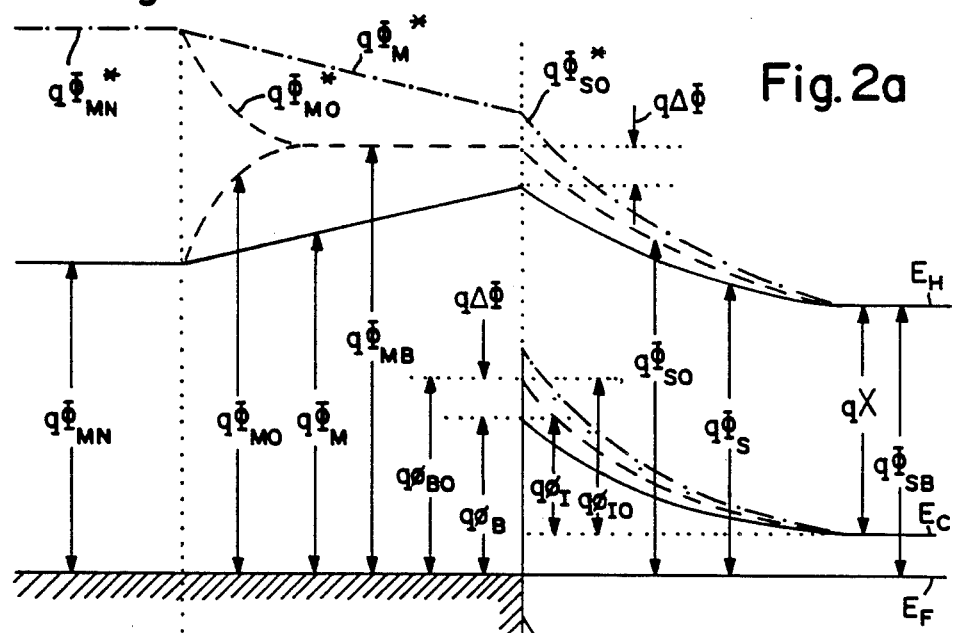
FIGS. 2a and 2b are an energy diagram and an associated structural schematic, respectively, useful in understanding the rectifier of FIG. 1.
Figure 2B:
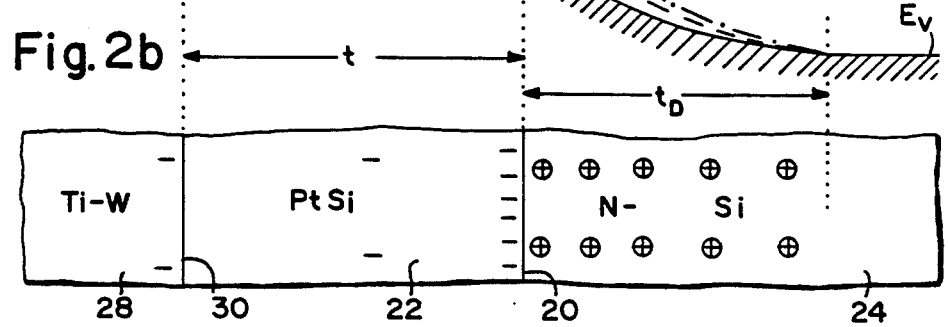

FIGS. 2a and 2b which respectively show an energy diagram and an associated schematic side view of a slice through N− region 24, silicide layer 22, and non-silicide layer 28 facilitate the qualitative understanding of the device physics leading to this phenomenon. To simplify the explanation, FIGS. 2a and 2b represent the case in which no external voltage is applied across the diode. The solid lines in FIG. 2a denote actual energy variations in the present diode for the case, as above, where $\phi_{BN}$ for the material of non-silicide layer 28 is less than $\phi_{BO}$ and where the composition of silicide layer 22 is uniform across its thickness (as with PtSi). The dashed lines in FIG. 2a denote the corresponding energy variations for the reference diode whose silicide layer thickness is effectively infinite.

The circled "+" signs in N− region 24 of FIG. 2b represent the bound positive charges of the depletion region whose width (thickness) is denoted as $t_D$. The "−" signs in layers 22 and 28 represent the electrons associated with the bound positive charges for achieving overall charge neutrality. These "−" signs are divided into one part along junction 20 for inducing the basic electric field across the depletion region and another part located in layers 22 and 28 away from junction 20 for inducing the field portion that penetrates through silicide layer 22.

The work function is generally denoted as $\Phi$ in electrostatic potential units or as $q\Phi$ in energy units. $\Phi_{SB}$ and $\Phi_{MB}$ are the bulk values of the N-type semiconductor and the metal silicide, respectively, when they are not interacting (i.e., there is no silicide-semiconductor rectifying junction). $\Phi_{SB}$ exists in the N-type semiconductor outside its charge depletion region. In order for rectification to occur, $\Phi_{MB}$ exceeds $\Phi_{SB}$. Also, the work function $\Phi_{MN}$ of non-silicide layer 28 (or the corresponding non-silicide layer in the reference diode) is less than $\Phi_{MB}$ (since $\phi_{BN}$ is less than $\phi_{BO}$ here).

With these considerations in mind, a good starting place is the Fermi energy $E_F$ which is constant in a Schottky-type diode in the absence of an applied voltage. The sum of $E_F$ and the work function at any point in the diode is the energy $E_H$ at which an electron is just free of the influence of the diode. Although $E_H$ varies, it is continuous across any conductor-semiconductor interface or any conductor-conductor interface.

Looking first at the reference diode, the intrinsic work function $\Phi_{SO}$ of its N-type region thereby increases from $\Phi_{SB}$ outside the depletion region to a maximum at its rectifying junction as progressively more energy is needed to raise an electron to $E_H$. Since $E_F$ is constant and $E_H$ is continuous, $\Phi_{SO}$ meets the intrinsic work function $\Phi_{MO}$ of the silicide layer of the reference diode at its rectifying junction. At that point, $\Phi_{MO}$ equals $\Phi_{MB}$. Near the interface between the silicide and non-silicide layers in the reference diode, $\Phi_{MO}$ drops down to $\Phi_{MN}$.

In the diode of FIG. 1, the actual work function $\Phi_S$ for N-region 24 similarly rises from $\Phi_{SB}$ outside the depletion region to a maximum at junction 20 where $\Phi_S$ meets the actual work function $\Phi_M$ for silicide layer 22. Likewise, $\Phi_M$ meets $\Phi_{MN}$ at junction 30. The important difference between the reference diode and the rectifier of FIG. 1 is that $\Phi_M$ is always less than $\Phi_{MB}$ because of the electric-field penetration into non-silicide layer 28. This generally lowers $\Phi_M$ as $\Phi_{MO}$ mixes with lower-valued $\Phi_{MN}$. Accordingly, the value of $\Phi_M$ at junction 20 is lower than $\Phi_{MO}$ at the rectifying junction of the reference diode by an amount $\Delta\Phi$.

The difference $\Delta\Phi$ is reflected down as the difference between $\phi_{BO}$ and $\phi_B$. This occurs because the difference $qX$ between $E_H$ and the lowest energy $E_C$ in the semiconductor conduction band is constant from point to point. As $E_H$ rises across the depletion region, $E_C$ rises in the same manner. The change in $E_C$ is the actual built-in semiconductor-to-conductor energy barrier $q\phi_I$ which is thereby $q\Delta\Phi$ less than the intrinsic built-in semiconductor-to-conductor energy barrier $q\phi_{IO}$. Similarly, $q\phi_B$ is the difference between $E_F$ and $E_C$ at junction 20. Consequently, $\phi$BO exceeds $\phi_B$ by $\Delta\Phi$.

Alternatively, $\Phi_{MN}$ for non-silicide layer 28 might exceed $\Phi_{MO}$. $\phi_B$ would then exceed $\phi_{BO}$. The dot-and-dash lines in FIG. 2a represent the actual energy variations for this complementary case, each of the relevent parameters being denoted with an "*". That is, the parameters $\Phi_{MN}^*$, $\Phi_M^*$, $\Phi_{MO}^*$, and $\Phi_S^*$ for the complementary case correspond respectively to $\Phi_{MN}$, $\Phi_M$, $\Phi_{MO}$, and $\Phi_S$. In the complementary case, the basic device physics is largely the same as in the main case except that the various differences are reversed in sign. Accordingly, no further explanation is necessary here.

For a pair of conductors, the difference between their work functions is representative of the difference between their barrier heights with the same semiconductor. In particular, the difference between $\Phi_{MO}$ and $\Phi_{MN}$ is representative of the difference between $\phi_{BO}$ and $\phi_{BN}$. The parameter $|(\phi_{BO}-\phi_B)/(\phi_{BO}-\phi_{BN})|$, hereafter usually referred to as $\epsilon$, is therefore indicative of the amount of work function mixing in the present diode.

Figure 3:
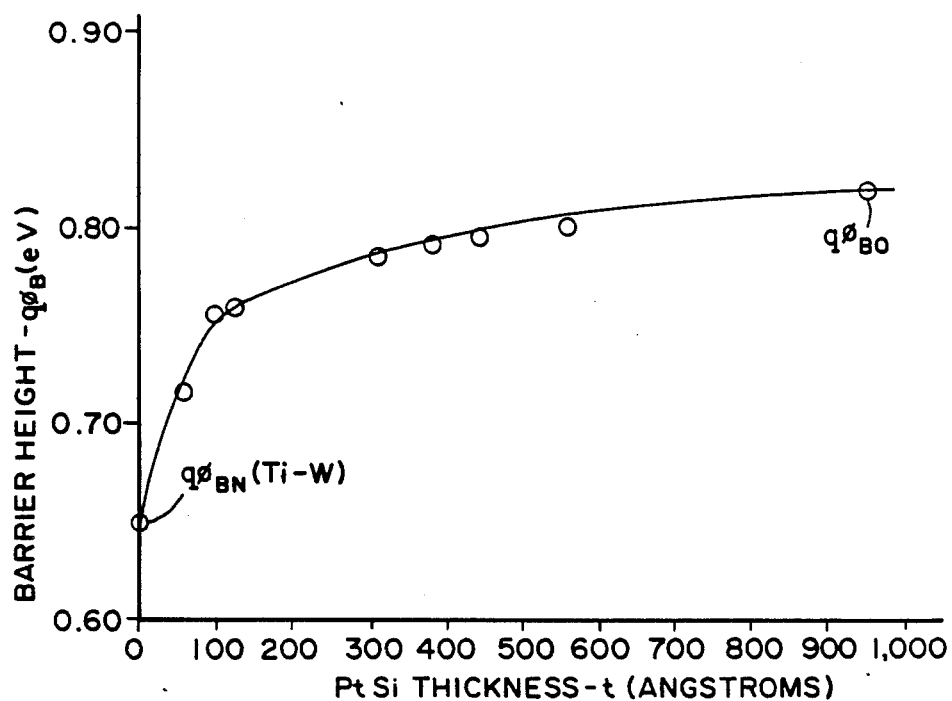
FIGS. 3 and 4 are graphs for the variation of $\phi_B$ and $|(\phi_{BO}-\phi_B)/(\phi_{BO}-\phi_{BN})|$, respectively, with silicide thickness in a PtSi Schottky-type diode.
Figure 4:
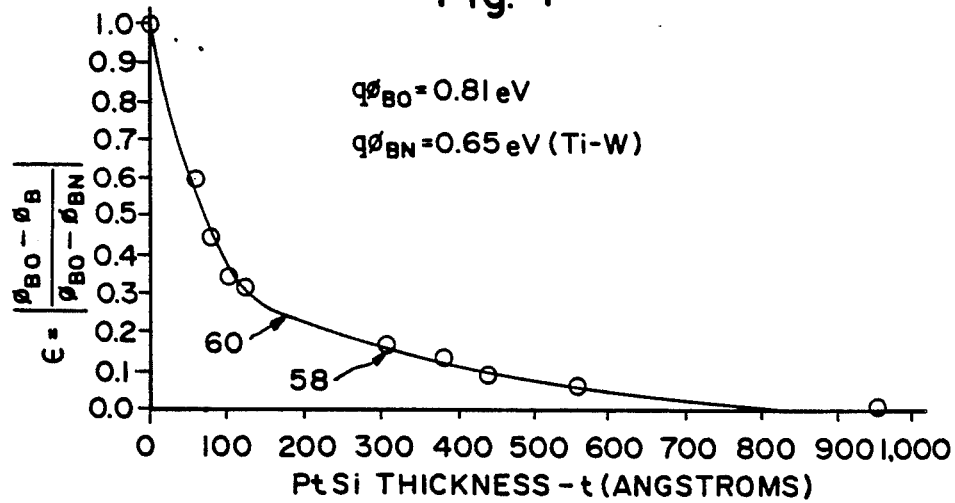

FIG. 3 is a graph showing the experimental variation of $\phi_B$ with silicide thickness t for the PtSi diode. The end points on this curve are $\phi_{BO}$ when t is effectively infinite—i.e., about 1,000 angstroms—and $\phi_{BN}$ when t is zero—i.e., N− region 24 directly adjoins non-silicide layer 28. FIG. 4 is a graph showing the corresponding curve for the variation of $\epsilon$ with t.

Some statistical variation does exist in the data shown. In addition, there is some difficulty in ascertaining t because of limitations in the measurement apparatus/technique. Allowing for statistical variation and measurement accuracy, it is nonetheless clear that $\phi_B$ is significantly different from $\phi_{BO}$ when t is about 300 angstroms or less. This corresponds to the range beginning at point 58 in FIG. 4 where $\epsilon$ is at least 15%. More particularly, the curve starts to bend sharply near the point 60 at which $\epsilon$ is about 25%. The range for $\epsilon$ greater than 25% is even more preferred since $\phi_B$ can vary greatly within this range for small changes in t.

Figure 5:
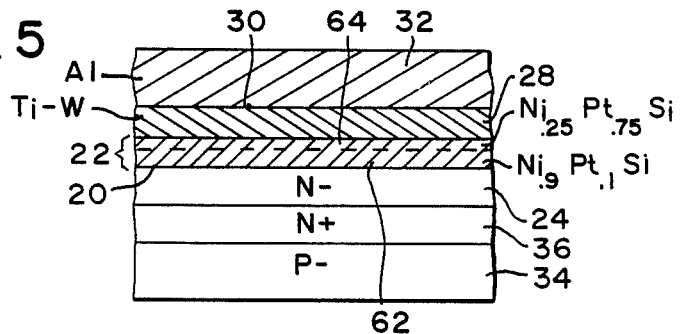
FIG. 5 is a partial cross-sectional side view of a structure containing a particular embodiment of the rectifier of FIG. 1.

Turning to FIG. 5, it illustrates an embodiment of the diode of FIG. 1 in which layer 22 is a silicide of nickel and platinum divided generally into a pair of layers 62 and 64. Lower layer 62 adjoins N— region 24 along interface 20 and consists of $Ni_Y Pt_{1-Y} Si$ where Y is variable between 0 and 1. Upper layer 64 adjoins non-silicide layer 28 along interface 30 and consists of $Ni_Z Pt_{1-Z} Si$ where Z is variable between 0 and Y. Accordingly, lower layer 62 is Ni-rich compared to upper layer 64. In the embodiment shown, Y is about 0.9, and Z is about 0.25. Non-silicide layer 28 again consists of Ti-W in the above proportions.

As stated above, the intrinsic barrier height $\phi_{BO}$ for the reference diode is defined with respect to a silicide layer having the same average composition as layer 22. This is important here because it takes into account the compositional difference between layers 62 and 64.

Layer 22 in the rectifier of FIG. 5 is preferably the remainder of an original silicide layer of greater thickness. In this case, $\phi_{BO}$ is defined with respect to a reference silicide layer which is the same as the original silicide layer along junction 20 and has the same average composition as the original silicide layer.

In the specific embodiment of FIG. 5, $q\phi_B$ is about 0.74 eV if the original silicide layer is formed to a thickness of about 1,000 angstroms in the manner described below. This value is approximately the appropriate $q\phi_{BO}$. The thickness $t_L$ of lower layer 62 is slightly under 500 angstroms. Depending on the thickness $t_U$ selected for upper layer 64, $q\phi_B$ can be adjusted to as low as 0.66 eV, this minimum arising when $t_U$ is zero. Again, the effect is clear when $\epsilon$ is 15% or more.

The ability to control $\phi_B$ by making upper layer 64 sufficiently thin is believed to occur because of electric-field penetration through silicide layer 22 into non-silicide layer 28. Although there are slight differences in the work-function mixing because layer 22 is divided into layers 62 and 64 of different average composition, the device physics is basically the same as described for FIGS. 2a and 2b.

Figure 6A:
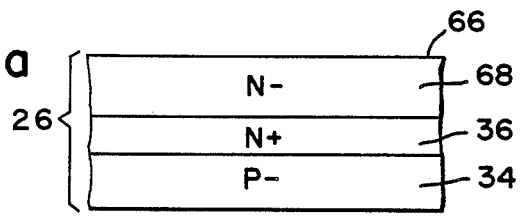
FIGS. 6a, 6b, 6c, and 6d are cross-sectional side views representing steps in a manufacturing process leading to the structure of FIG. 5.

FIGS. 6a, 6b, 6c, and 6d illustrate steps in a method for fabricating the particular rectifier shown in FIG. 5. In this method, silicon semiconductor body 26 is initially processed in the manner described above for the rectifier of FIG. 1 up through the creation of the windows for the diode and the electrical contact (not shown here) down to the exposed silicon surface 66 of the N— portion 68 remaining from the original epitaxial layer. At this point, the structure appears as shown in FIG. 6a in which N— region 68 downwardly adjoins buried region 36. Body 26 preferably also includes doped regions 42, 44, and 48 at this point as shown in FIG. 1 but not illustrated here. In the following steps, layers 50, 52, and 56 for the contact are preferably formed at the same time, with the same materials, and to the same thicknesses as layers 22, 28, and 32, respectively. To simplify the discussion, no further reference is made to the contact.

Figure 6B:
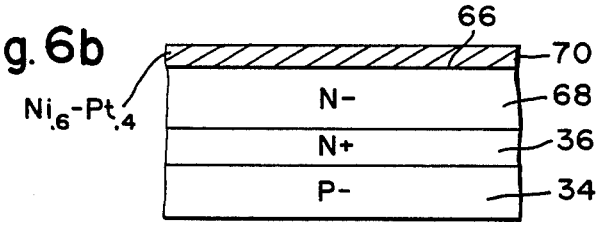
Figure 6C:
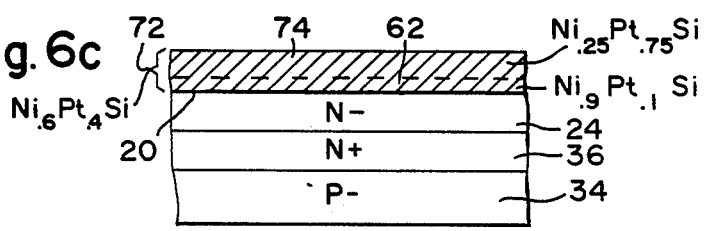

A metallic layer 70 of Ni-Pt in the proportions of 60% nickel to 40% platinum is now deposited according to conventional sputtering techniques to a thickness of about 500 angstroms on surface 66 as depicted in FIG. 6b. The structure is sintered for 20 minutes at 500° C. in an environment of dry nitrogen with 1% hydrogen to cause the nickel and platinum to react with silicon along surface 66 and form an original silicide layer 72 which adjoins the remainder 24 of N— region 68 along interface 20 as shown in FIG. 6c. The resulting thickness of silicide layer 72 is about 1,000 angstroms, while its average composition is $Ni_{.6}Pt_{.4}Si$. During this sintering step, silicide layer 72 actually forms as lower silicide layer 62 and an original upper silicide layer 74. The average composition of lower layer 62 is about $Ni_{.9}Pt_{.1}Si$. The average composition of upper layer 74 is about $Ni_{.25}PT_{.75}Si$. Any Ni-Pt that has not reacted to form silicide is then removed by etching with room-temperature aqua regia.

Figure 6D:
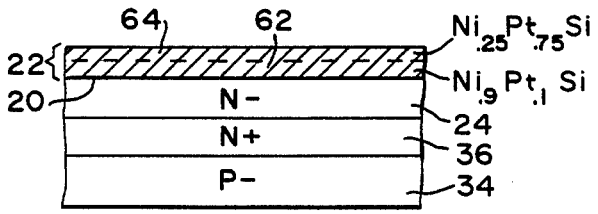

A portion of the thickness of upper layer 74 is removed by milling with argon ions so as to leave silicide layer 22 of which upper portion 64 is the remainder of original upper layer 74 as shown in FIG. 6d. A 1,000-angstrom layer of Ti-W at the above proportions is deposited according to conventional sputtering techniques on the top of the structure and suitably etched with hydrogen peroxide to define non-silicide layer 28 as shown in FIG. 5. In a similar manner, a layer of aluminum with about 1% copper is deposited on the top of the structure and suitably patterned by etching with sulfuric/phosphoric acid to create layer 32. As indicated above, lower layer 62 is so thin that removal of the portion of original upper 74 enables $\phi_B$ to be reduced from about 0.74 eV when upper layer 74 is intact to about 0.66 eV when upper layer 74 is entirely gone.

While the invention has been described with reference to particular embodiments, this description is solely for the purpose of illustration and is not to be construed as limiting the scope of the invention claimed below. For example, the non-silicide layer might consist of appropriately doped silicon or some other material that is not a barrier metal. Thus, various modifications, changes, and applications may be made by those skilled in the art without departing from the true scope and spirit of the invention as defined by the appended claims.

What is claimed is:

1. A method of forming a rectifier, the method comprising the steps of:
    depositing a metallic layer composed of at least two selected metals on an exposed surface of an N-type silicon semiconductive region in a semiconductor body:
    subsequently heating the body and the metallic layer to a suitable temperature to cause the metals to react with silicon along the surface and form an original metal silicide layer which adjoins the remainder of the N-type region along an interface therebetween, the metals and impurity dopant concentration of the N-type region being so selected that the interface is a rectifying junction, the original silicide layer forming as at least a first layer adjoining the remainder of the N-type region and an original second layer overlying the first layer across from the junction and having a different average composition than the first layer;
    removing at least part of the thickness of the original second layer across from the junction so as to leave a remaining metal silicide layer, the first layer being sufficiently thin that removal of the part enables the actual conductor-to-semiconductor barrier height $\phi_B$ at the junction to be controlled depending on the degree of removal; and forming a conductive non-silicide layer on the remaining silicide layer, the absolute value of $(\phi_{B0}-\phi_B)/(\phi_{B0}-\phi_{BN})$ being not less than 0.15 where $\phi_{B0}$ is the intrinsic conductor-to-semiconductor barrier height at an interface between material which is the same as that of the N-type region along the junction and material which is the same as that of the original silicide layer along the junction and has the same average composition as the original silicide layer and where $\phi_{BN}$ is the conductor-to-semiconductor barrier height as an interface between material which is the same as that of the N-type region along the junction and material which is the same as that of the non-silicide layer.

2. A method of forming a rectifier, the method comprising the steps of:

depositing a metallic layer composed of nickel and platinum on an exposed surface of an N-type silicon semiconductive region in a semiconductor body;

subsequently heating the body and the metallic layer to a suitable temperature to cause the metals to react with silicon along the surface and form an original metal silicide layer which adjoins the remainder of the N-type region along an interface therebetween, the metals and impurity dopant concentration of the N-type region being so selected that the interface is a rectifying junction, the original silicide layer forming as at least a first layer adjoining the remainder of the N-type region and an original second layer overlying the first layer across from the junction and having a different average composition than the first layer, the average composition of the first layer being substantially $Ni_YPt_{1-Y}Si$ where Y is variable between 0 and 1, the average composition of the original second layer being substantially $Ni_ZPt_{1-Z}Si$ where Z is variable between 0 and Y;

removing at least a specified part of the thickness of the original second layer across from the junction so as to leave a remaining metal silicide layer; and forming a conductive non-silicide layer on the remaining silicide layer.

3. A method as in claim 1 characterized in that the average composition of the first layer is substantially $Ni_YPT_{1-Y}Si$ where Y is variable between 0 and 1 and that the average composition of the second layer is substantially $Ni_ZPT_{1-Z}Si$ where Z is variable between 0 and Y.

4. A method as in claim 2 characterized in that the first layer is sufficiently thin that removal of the specified part of the original second layer enables the actual conductor-to-semiconductor barrier height $\phi_B$ at the junction to be controlled depending on the degree of removal.

* * * * *